United States Patent [19]

Kimmich

[11] 4,041,894

[45] Aug. 16, 1977

[54] ELECTRONIC ARRANGEMENT FOR GENERATING TWO ALTERNATING VOLTAGES WHOSE PHASES ARE SHIFTABLE

[75] Inventor: Klaus Kimmich, Stuttgart, Germany

[73] Assignee: International Standard Electric Corporation, New York, N.Y.

[21] Appl. No.: 717,849

[22] Filed: Aug. 26, 1976

[30] Foreign Application Priority Data

Sept. 5, 1975 Germany .......................... 2539498

[51] Int. Cl.$^2$ .................... B05C 5/02; H03K 5/00
[52] U.S. Cl. ................................ 118/7; 118/629; 118/625; 118/DIG. 21; 307/261; 328/21
[58] Field of Search .......... 118/629, 630, 625, 627, 118/624, 325, 7, DIG. 21; 427/32, 117, 286; 307/261, 262; 328/21

[56] References Cited

U.S. PATENT DOCUMENTS

| | | | |
|---|---|---|---|
| 3,601,707 | 8/1971 | Bauer | 307/261 |
| 3,638,612 | 2/1972 | Haise et al. | 118/629 X |
| 3,731,655 | 5/1973 | Griesser | 118/DIG. 21 |
| 3,796,960 | 3/1974 | Frizzell | 307/261 X |
| 3,800,167 | 3/1974 | Smith | 307/261 X |
| 3,836,853 | 9/1974 | Cracraft et al. | 307/261 X |

FOREIGN PATENT DOCUMENTS

1,034,146 6/1966 United Kingdom ........ 118/DIG. 21

*Primary Examiner*—Mervin Stein
*Attorney, Agent, or Firm*—John T. O'Halloran; Thomas M. Marshall

[57] ABSTRACT

An electronic arrangement for generating, from a reference value proportional to the rate of movement, for example, from an a.c. voltage generated by a means of a tachometer generator, two a.c. voltages which can be shifted in phase with respect to each other by a constant frequency-independent amount. An arrangement is provided in which a variable input a.c. voltage is changed to a triangular voltage of constant amplitude and proportional in frequency to the a.c. voltage. There is a first square-wave voltage derived from the triangular voltage and the triangular voltage is inverted. The inverted and uninverted triangular voltage are each applied to one input of two comparators and a manually variable d.c. voltage is applied to the second input of each comparator. The d.c. voltage is manually variable between the maximum and minimum amplitudes of the triangular voltage. The outputs of the two comparators are connected to a bistable multivibrator which generates a second square-wave voltage shiftable in phase by the angle $\psi$ with respect to the first square-wave voltage by varying the d.c. voltage.

3 Claims, 10 Drawing Figures

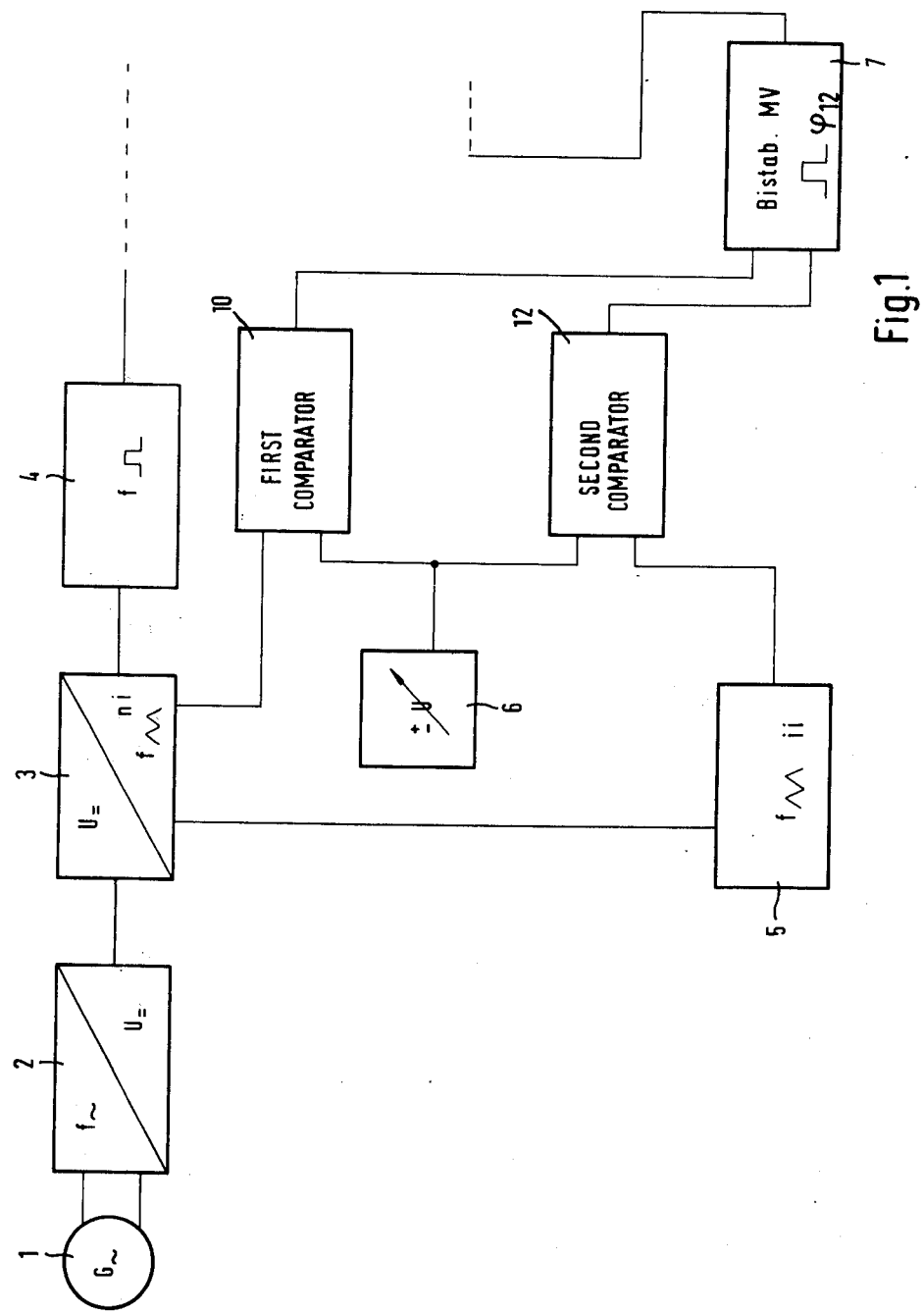

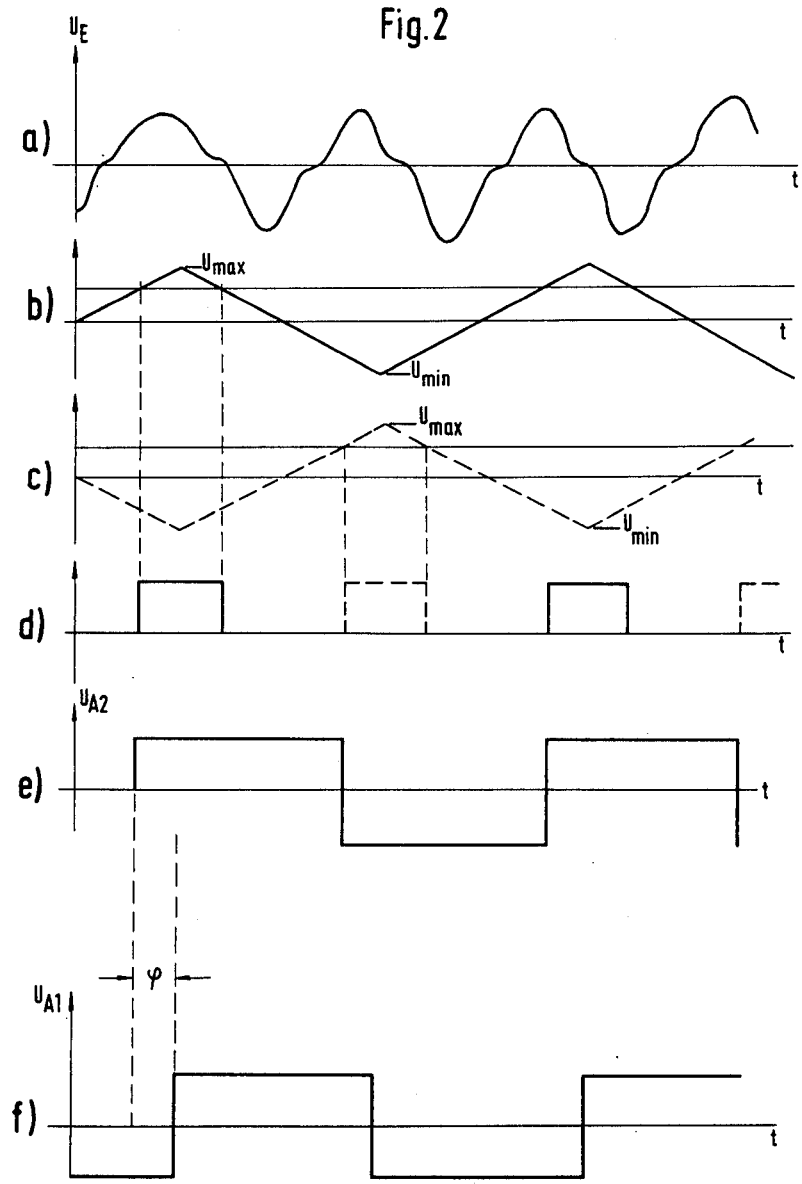

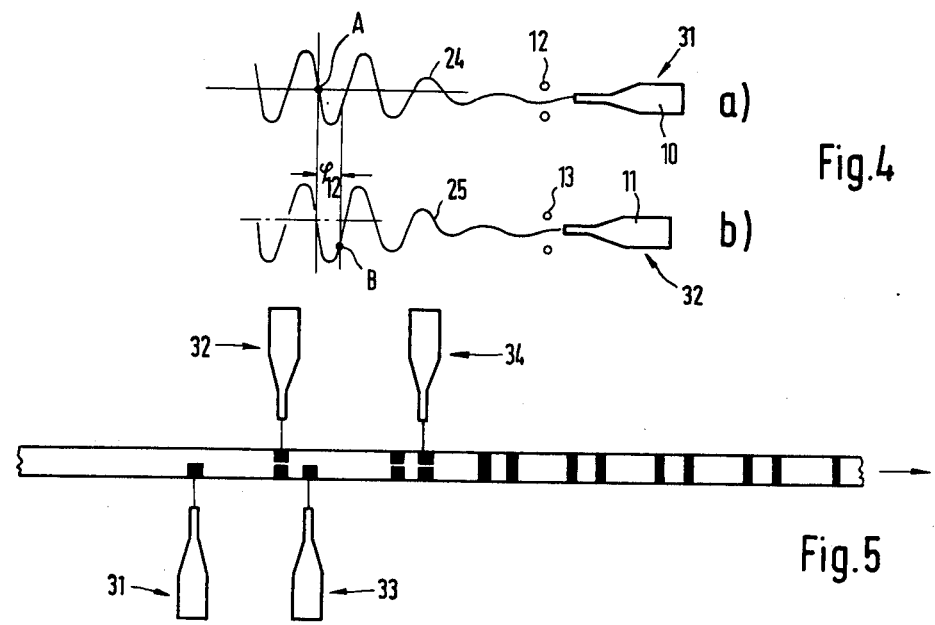
Fig. 4
Fig. 5
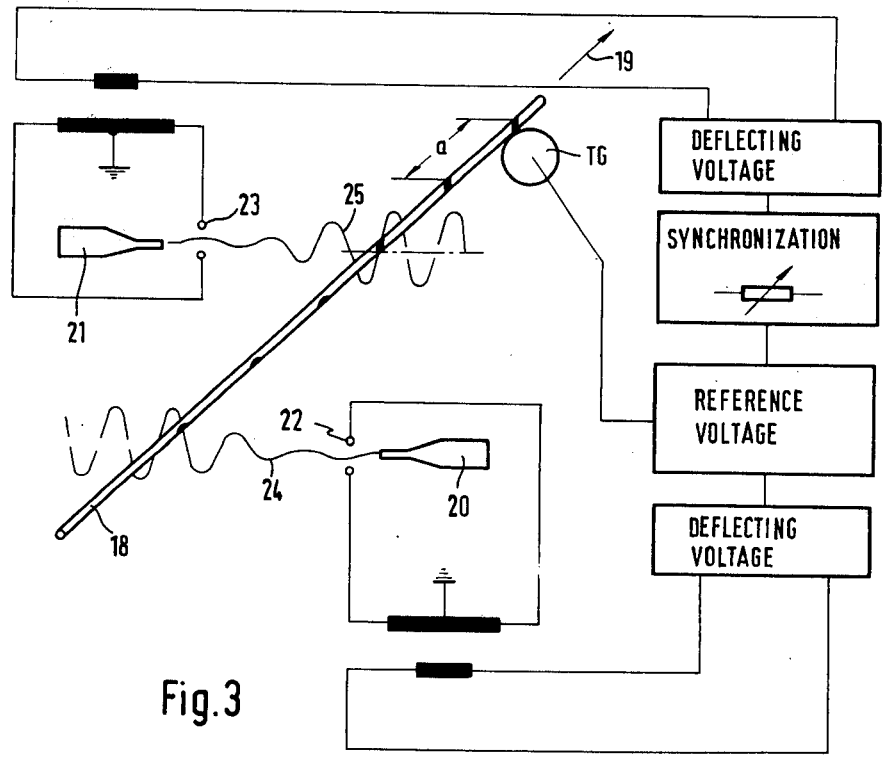
Fig. 3

4,041,894

ELECTRONIC ARRANGEMENT FOR GENERATING TWO ALTERNATING VOLTAGES WHOSE PHASES ARE SHIFTABLE

BACKGROUND OF THE INVENTION

Devices are needed for generating alternating voltages whose phases are shiftable relative to each other.

Alternating voltages which are continuously shiftable in phase by a constant angle independently of their frequency are needed to control machining operations on workpieces. If, for example, a workpiece is moved at a variable speed past several machining tools arranged in tandem in the direction of movement and the machining tools are to perform an operation at at least two points of the workpiece spaced a fixed distance independently of the rate of movement, means to control the tools are required. This can be achieved by controlling the tools by means of a.c. voltages shiftable in phase with respect to each other by a constant, frequency-independent angle.

SUMMARY OF THE INVENTION

It is the object of this invention to provide an electronic arrangement which generates from a reference value proportional to the rate of movement, for example, from an a.c. voltage generated by means of a tachometer generator, two a.c. voltages which can be shifted in phase with respect to each other by a constant, frequency-independent amount.

A first square-wave is derived from the triangular voltage, which is in turn derived from the a.c. voltage reference. The triangular voltage is inverted. The inverted and uninverted triangular voltages are each applied to one input of two comparators, each of whose second inputs is supplied with a d.c. voltage which is manually variable between the maximum and minimum amplitudes of the voltages. The outputs of the two comparators are connected to a bistable multivibrator shiftable in phase by an angle $\psi$ with respect to the first square-wave voltage by varying the d.c. voltage.

In the specific form of the device illustrated in the Figures and described below the practical application of the device is to control an apparatus for producing ring marks on electrical conductors.

BRIEF DESCRIPTION OF THE DRAWINGS

FIG. 1 is a block diagram of the electronic arrangement of this invention;

FIG. 2 illustrates the voltage waveforms $a$ through $f$ in the stages of the device illustrated in FIG. 1;

FIG. 3 is a schematic illustrating the structure of an apparatus for producing ring marks on electrical conductors;

FIG. 4 is a schematic illustrating the principle of the synchronization of two half rings;

FIG. 5 is a schematic illustrating the principle of the production of several rings from four half rings;

DESCRIPTION OF THE PREFERRED EMBODIMENT

Figure 6:
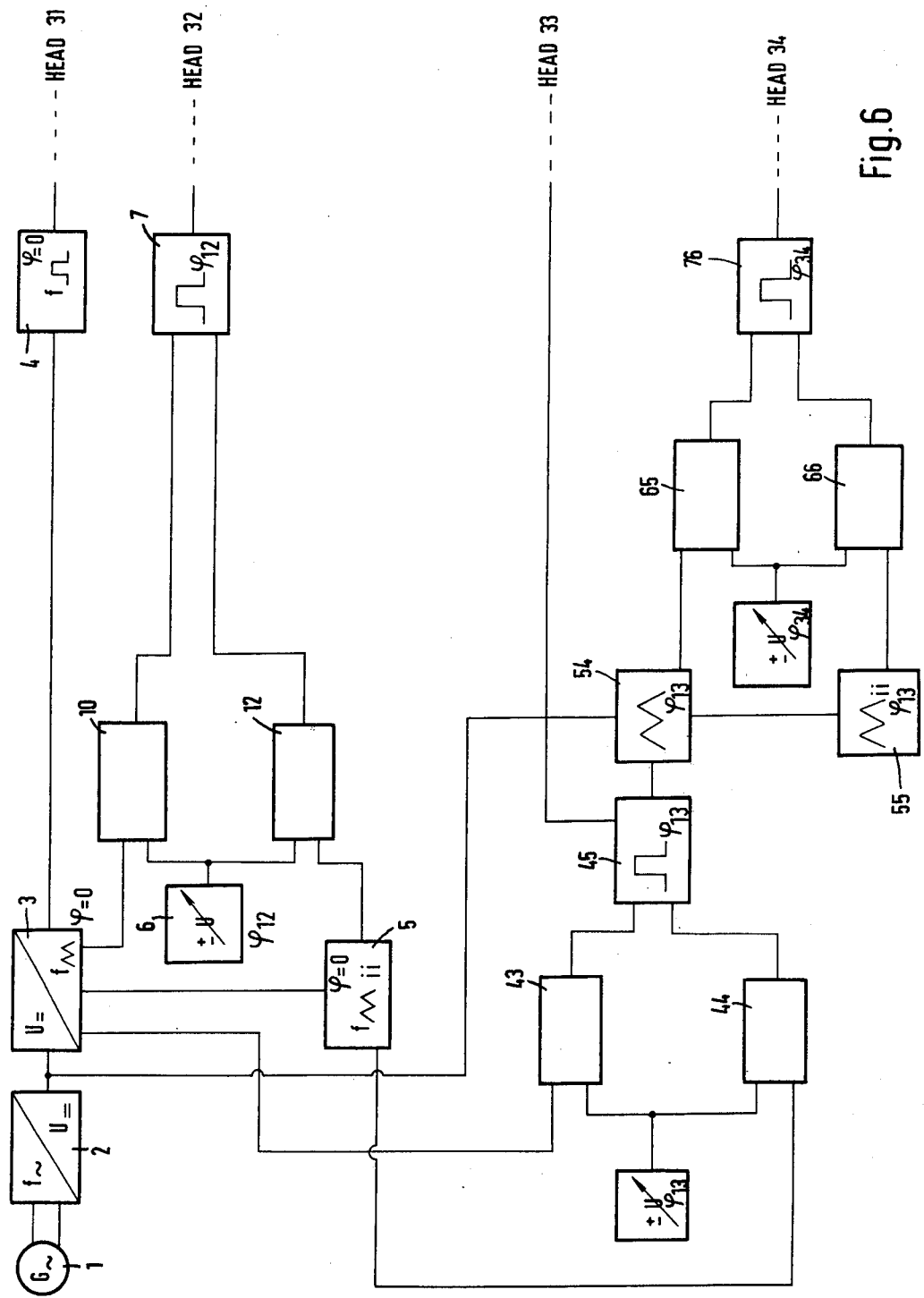
FIG. 6 is a block diagram of the electronic arrangement of this invention for generating three a.c. voltages shiftable in phase with respect to a fourth a.c. voltage by a different amount.

FIG. 1 is a block diagram showing the basic structure of the electronic arrangement for generating two output a.c. voltages variable in frequency and of constant amplitude which are continuously shiftable in phase with respect to each other by a constant, frequency-independent angle $0 < \psi < 180°$. The most important input and output voltages produced by the device illustrated in FIG. 1 are plotted in FIG. 2.

In FIG. 1 the reference value for the output a.c. voltage is the output voltage of a tachometer generator 1, which provides a more or less sinusoidal a.c. voltage variable in frequency which is driven by a moving workpiece or workpiece carrier such as a conveyor belt. For the purposes of this description it is assumed that the tachometer voltage has the shape illustrated in FIG. 2a and that its frequency is proportional to the rate of movement of the workpiece. The input a.c. voltage is first converted in block number 2 to a d.c. voltage proportional to the frequency of the input a.c. voltage. In block 3, the d.c. voltage is changed to a triangular voltage of constant amplitude and proportional to the frequency of the a.c. voltage, as described in detail below. The waveform of the triangular voltage is illustrated in FIG. 2b and it has an amplitude which is constantly $U_{max}$ or $U_{min}$. The triangular voltage is converted in the same circuit to a constant amplitude square-wave voltage of the same frequency which is shifted in phase by 90° by a circuit illustrated in block 4. This is the reference output a.c. voltage, in the present case a square-wave voltage with the phase position 0 whose waveform is illustrated in FIG. 2f.

The triangular voltage is inverted by the device illustrated in block 5. The uninverted triangular voltage is connected to one input of a first comparator 10. The inverted triangular voltage is applied to one input of a second comparator 12. The other inputs of comparators 10 and 12 are fed with a d.c. voltage generated in block 6 which is manually variable in amplitude between $U_{max}$ and $U_{min}$ of the triangular voltage. The effect of this is illustrated in FIGS. 2b and 2d. FIG. 2c shows the waveform of the inverted triangular voltage. Also shown in FIGS. 2d and 2c is a positive d.c. voltage which is generated in block 6 and corresponds to about $0.5\ U_{max}$.

As shown in FIG. 2d, with such voltages at the inputs of comparators 10 and 12, the comparator 10 provides squarewave pulses shown by the solid lines while the comparator 12 provides the dashed square-wave pulse, in which case two pulse trains are applied to the bistable multivibrator represented by block 7, which provides a square-wave voltage as seen in FIG. 2e. This voltage has the same frequency as that illustrated in FIG. 2f but is shifted in phase with respect to that of FIG. 2f by the angle $\psi$. The amount of the phase shift is determined by the magnitude of the d.c. voltage applied to comparators 10 and 12.

FIGS. 3, 4 and 5 show how the above-described electronic arrangement is utilized in an apparatus for producing ring marks on insulated electrical conductors or on any other strand-shaped workpiece. FIG. 3 shows an insulated electrical conductor 18 which is advancing at a constant speed in the direction of the arrow 19 and on which ring marks are to be made with a spacing $a$. This is done by positioning, on either side of the longitudinally advancing conductor 18, a spraying nozzle 20, 21 whose color jet 24, 25 is set into approximately sinusoidal oscillation in a deflection system 22, 23. At each crossing of the oscillating color jet, each color jet 24, 25 produces a color half ring on the conductor 18. This principle is known in the art and is described in German printed application No. 1,920,966.

To form a single ring from the two half rings, it is necessary to control the second color jet so that it has a zero crossing whenever the first color half ring moves past the second color jet or in other words a phase shift at a predetermined angle $\psi$ has to be produced between the two oscillating color jets.

The necessity of the phase shift between the oscillating color jets produced by heads 31 and 32 will now be illustrated in connection with FIG. 4. For simplicity, a unit consisting of a spraying nozzle and a deflection system will hereinafter be referred to as a head so that the embodiment illustrated in FIGS. 3 and 4, in an apparatus for producing single rings, the head 31 comprises the spraying nozzle 20 and the deflection system 22 and the head 32 comprises the spray nozzle 21 and the deflection system 23. In FIGS. 4a and 4b the two oscillating color jets 24, 25 produced by heads 31 and 32 are shown at time $t$. At this time the oscillating color jet 24 of the head 31 produces a colored half ring (FIG. 4a, zero crossing of the oscillation, point A). At the same time $t$, however, color particles which are to produce the second color half ring at the same time $t_1$ by means of the oscillating color jet 25 produced by the head 32, are produced at the point B (4b). Hence the oscillating color jet of head 2 must be shifted in phase with respect to the oscillating color jet of head 1 by the angle $\psi_{12}$.

In the known marking apparatus as described in German printed application 1,902,966, this is obtained as follows: one of the heads for example head 31 was fixed, while the other head, for example head 32 was shiftable parallel or perpendicular to the conductor 18, and the phase angle was adjusted by shifting this head. The correct phase position or the congruence of the two colored half rings can be checked by means of a strobiscopic lamp controlled by the oscillation frequency of the second color jet. This known mechanical synchronization of the two oscillating color jets necessitates a considerable amount of precision components which also make such an apparatus unnecessarily susceptible to trouble. The amount of mechanical apparatus required for synchronization will become apparent from the consideration of the device illustrated in FIG. 5 which shows the principle of the production of double rings on a conductor 8. One ring of the double ring, as in the case of the single ring, is produced by oscillating color jets of the heads 31 and 32 with the phase angle $\psi_{12}$ between the two color jets having to be adjusted. The first half ring of the second ring of a double ring is produced by the oscillating color jet of the head 33; the phase of this color jet must differ from that of the color jet of the head 31 between angle $\psi_{13}$. The second half ring of the second ring of a double ring is produced by the oscillating color jet of the head 34; this color jet must differ in phase from that of the head 32 by the angle $\psi_{34}$, which, in the present case, is equal to $\psi_{12}$. All three phase angles must be adjustable however. This shows that in connection with the known apparatus the mechanical synchronization required a large amount of mechanical components and considerable manual operation.

This complexity is substantially reduced by the use of the electronic arrangement in accordance with the invention. In the apparatus of this invention for producing ring marks, all heads 31, 32, 33, 34 are fixed, and the phase differences between the oscillating color jets are produced by one or more electronic arrangements of the kind illustrated in connection with FIG. 1. The adjustment need no longer be performed on the spot, but can also be effected by remote operation or remote supervision. For the production of single rings, this is indicated in FIG. 3 by the two blocks "Reference Voltage" and "Synchronization". The tachometer generator TG corresponds to the tachometer generator of FIG. 1. The block "reference voltage" contains the blocks 2, 3 and 4 of FIG. 1. The deflecting voltage for the head 31 is generated from the square-wave voltage produced by the block 4 and having the reference phase postion $\psi = 0$. The block "Synchronization" of FIG. 3 contains the blocks 6 and 7 and the comparators 1 and 2 of FIG. 1. By varying the d.c. voltage of the block 6, for example, by means of a potentiometer, the desired phase of position $\psi_{12}$ of the square-wave voltage generated in block 7 is adjusted. On this square-wave voltage the deflecting voltage for the head 32, is generated.

The generation of the deflecting voltage from the square-wave voltages is described in U.S. application Ser. No. 691,947, assigned to the same assignee as this invention. The same principle of an electronic arrangement described in the apparatus of FIG. 3 to generate two deflecting voltages shiftable in phase with respect to each other can also be used for producing double rings, which, as described in connection with FIG. 5, necessitates four deflecting voltages whose phases are to be shiftable relative to each other.

The block diagram for an electronic arrangement for an apparatus which produced double ring markings is illustrated in FIG. 6. The upper half of the block diagram is identical to the block diagram of FIG. 1. To generate the square-wave voltage shiftable in phase between angle $\psi_{13}$, from which the deflecting voltage for the third head 33 is derived, the inverted and the uninverted triangular voltage with the reference phase position $\psi = 0$ of block 3 is applied to an additional pair of comparators, comparators 43 and 44. The other two inputs of the comparators 43 and 44 are fed with a d.c. voltage by means of which the phase angle $\psi_{13}$ is adjusted. The bistable multivibrator 45 following the comparators 43, 44 generates a square-wave whose phase differs from that of the square-wave voltage of the block 4 by the angle $\psi_{13}$.

To generate the square-wave voltage with the phase angle $\psi_{34}$ from which the deflecting voltage for the head 34 is derived, the square-wave voltage with the phase angle $\psi_{13}$ is taken as the reference voltage. From this square-wave a triangular voltage of the same frequency and of constant amplitude is first generated (block 54). This triangular voltage as well as the triangular voltage inverted in the block 55 are applied to another pair of comparators, comparators 65, 66 to whose second inputs is applied a d.c. voltage according to the desired phase angle $\psi_{34}$. The outputs of the comparators 65, 66 are connected to the bistable multivibrator block 76 which generates square-wave voltage fixed in phase by $\psi_{34}$, from which the deflecting voltages for the fourth head 34 is derived. In the case of a change in the phase position $\psi_{13}$, the phase $\psi_{34}$ thus is changed by the same amount. $\psi_{34}$ can be adjusted individually by varying the control d.c. voltage for $\psi_{34}$.

Figure 7:
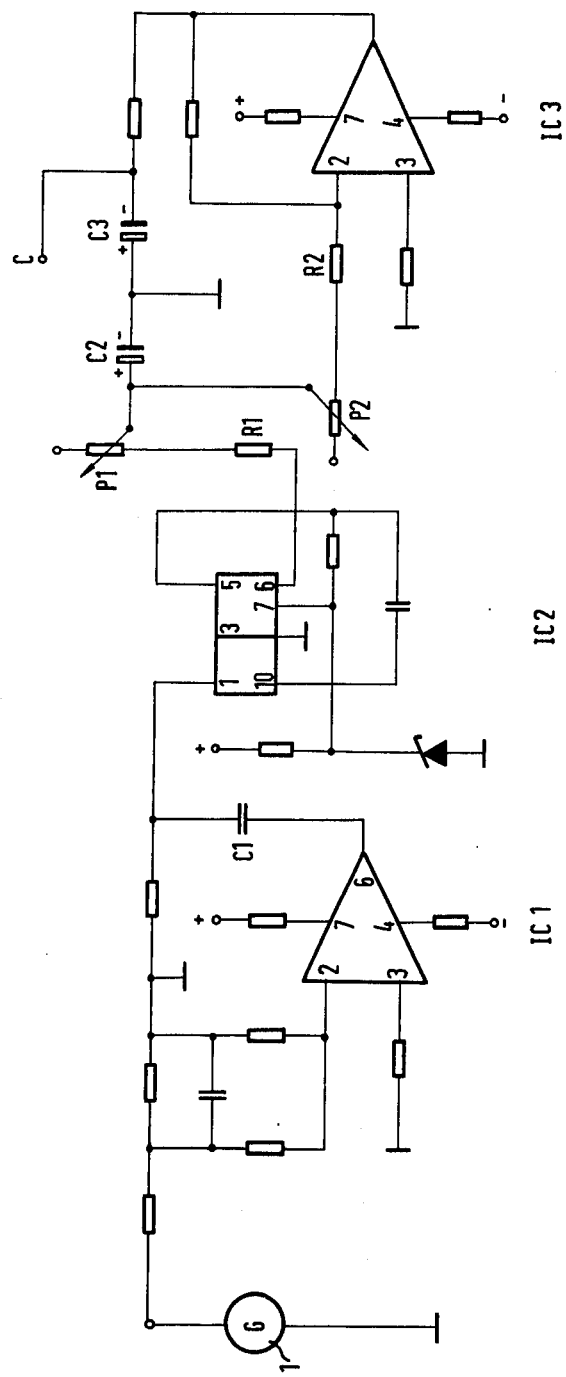
FIG. 7 is a circuit diagram illustrating an arrangement for converting the input a.c. voltage to a d.c. voltage proportional to the frequency of the input a.c. voltage.

FIG. 7 shows a circuit diagram for implementing the function indicated in block 2 of FIG. 1. In other words, the a.c. voltage of tachometer generator 1 is converted to a d.c. voltage proportional to the frequency of the a.c. voltage. Integrated circuit IC 1 acts as a pulse shaper which changes the more or less sinusoidal voltage of the tachometer generator 1 to a square-wave voltage of the same frequency. The square-wave voltage appearing at the terminal 6 of IC 1 is differentiated by capacitor C1. The resulting needle pulses are applied to the control input (terminal 1) of IC 2, a monostable multivibrator which generates square-wave pulses of constant amplitude and duration. These square-wave pulses appearing at the terminal 6 of IC 2 are summed up by means of P1 and C2 whereby a smoothed d.c. voltage is obtained which is proportional to the frequency of the tachometer 1 voltage and does not follow fast variations in the tachometer frequency which may be caused by slip in the tachometer disc and the insulated conductor and by means of mechanical oscillations of the conductor because R1, P1 and C2 are suitably proportioned. Through P2 and R2 this d.c. voltage is passed to IC 3 in which it is linearly amplified and then it is smoothed again by capacitor C3. The frequency-proportional d.c. voltage is available at the terminal C.

Figure 8:
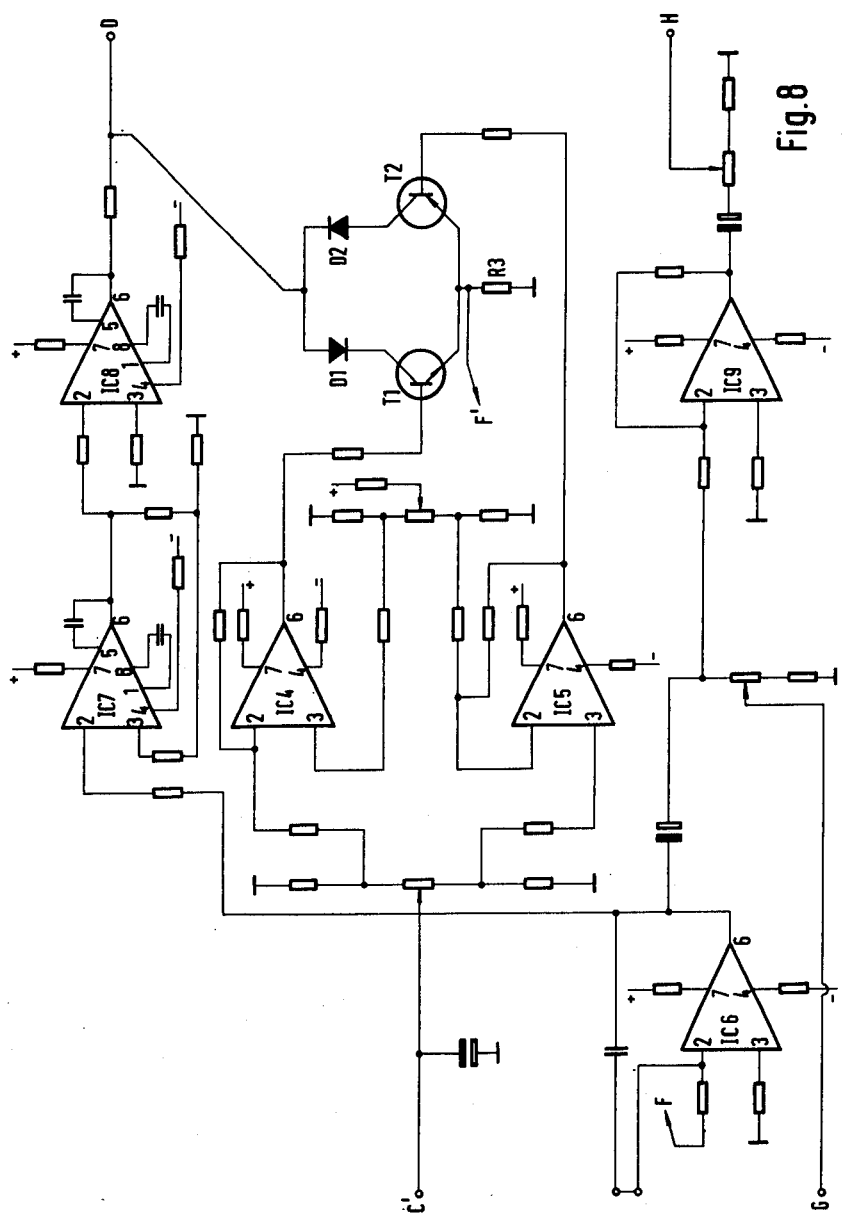
FIG. 8 is a circuit diagram illustrating an arrangement for generating triangular voltages from the frequency-proportional d.c. voltage.

FIG. 8 shows a circuit arrangement which changes the frequency proportional d.c. voltage to a frequency-proportional square-wave voltage and a triangular voltage. The circuit arrangement represents a controlled wobbulated triangular-wave generator which generates, simultaneously with the triangular voltage, a sqaure-wave voltage whose phase is shifted 90° relative to the phase of the triangular voltage. The circuit arrangement comprises blocks 3, 4 and 5 of FIG. 1.

Operational amplifier IC 6 is connected as an integrator and IC 7 is a comparator. Part of the output voltage of the IC 7 is fed back to input 3 of IC 7. When the two inputs terminals 2, 3 of IC 7 are at the same potential the voltage at the output reverses its sign. The voltage at the output 6 thus jumps from one supply voltage (+) to the other (−) whereby a square-wave voltage is obtained. This square-wave voltage is inverted in the IC 8 for reasons of circuit design. At the terminal D, corresponding to the output of the block 4 of FIG. 1, a square-wave voltage of constant amplitude is provided which is used as a central control signal with the reference phase position $\psi = 0$.

The frequency-proportional d.c. voltage is applied to the input C'. It is made bipolar and amplified in the operational amplifiers IC 4 and IC 5 used as d.c. voltage amplifiers and then fed to an electronic switch consisting of D1, D2, T1 and T2 and gated by the square-wave voltage at D. At the common emitter resistor R3 of T1 and T2 square-wave pulses are equal in frequency to the square-wave voltage at D but whose amplitude varies with frequency, i.e. if the d.c. voltage C' corresponds to a low frequency: small-amplitude, elongated squarewave pulses will be obtained. In the case of a high frequency equal-area, high amplitude, short square-wave pulses will be obtained.

These frequency proportional sqaure-wave pulses are applied to the input 2 of the IC 6 where they are integrated. IC 6 provides at its output a triangular voltage which is equal in frequency to the square-wave voltage at D and can be taken from the output G in uninverted form and from the output H in inverted form (from IC 9). The amplitudes of the two triangular voltages are constant, in other words, they are not frequency-dependent.

Figure 9:
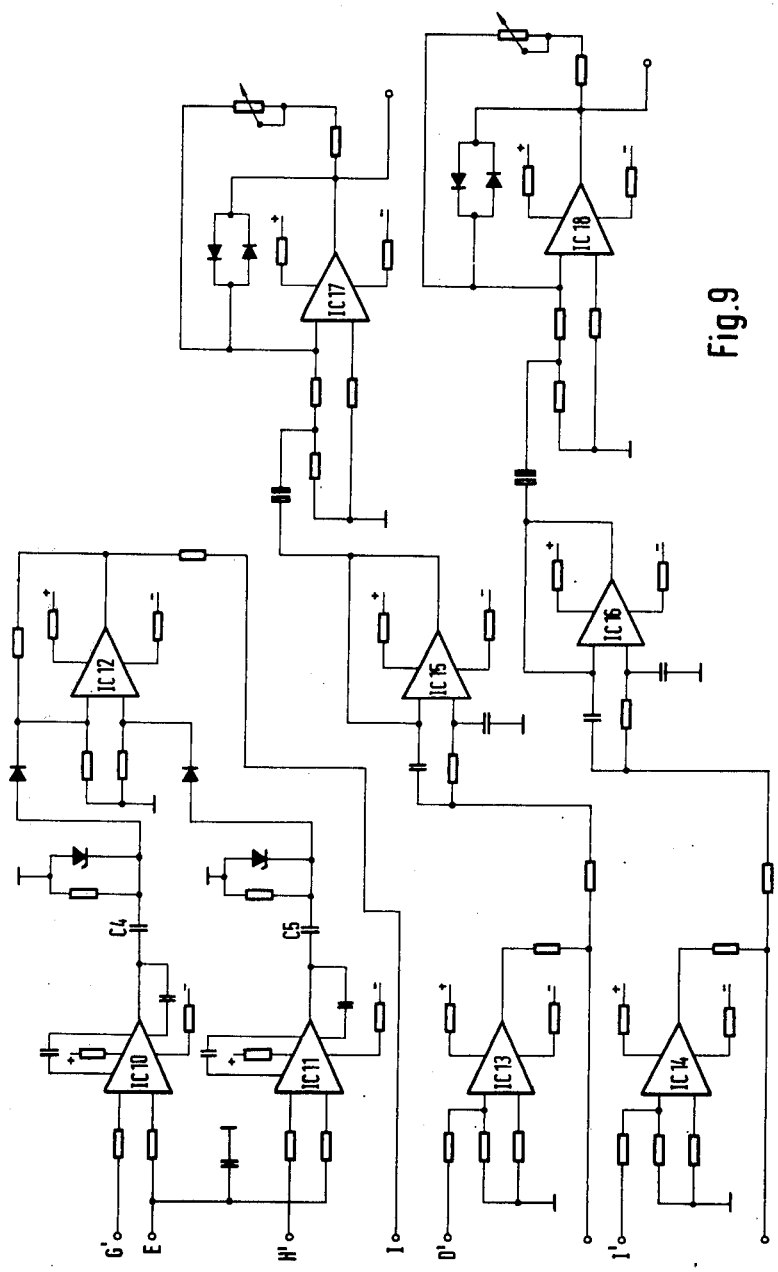
FIG. 9 is a circuit diagram of an arrangement of the comparators and the bistable multivibrator illustrated in FIG. 1.

The circuit arrangement at the upper left of FIG. 9 corresponds to comparators 1 and 2 and to the blocks 6 and 7 of FIG. 1 and represents the phase stabilizer proper. The two operational amplifiers IC 10 and IC 11 are connected as comparators 10 and 12 of FIG. 1. The uninverted triangular voltage from the output G of FIG. 8 is applied to the input G', and the inverted triangular voltage from the output H of FIG. 8 is applied to the input H'. The input E is fed with a d.c. voltage corresponding to the desired phase shift. This d.c. voltage is derived from a power supply unit, (not shown) and adjusted by means of a voltage divider (potentiometer). The output voltages of IC 10 and IC 11 are differentiated by capacitors C4 and C5, respectively. Of the needle pulses obtained, only the positive ones are applied to the inputs of IC 12, a bistable multivibrator. At its output I, the IC 12 provides a square-wave voltage which, according to the d.c. voltage entered at E, is shifted in phase by a given angle with respect to the square-wave voltage at D (FIG. 8 and FIGS. 2e and 2f). The lower part of FIG. 9 shows a circuit arrangement which processes the out of phase sqaure-wave voltage and the in-phase square-wave voltage in order to obtain the deflecting voltages for the heads 21 and 22 of the marking apparatus. The out of phase square-wave voltage is applied to the input I' and the in-phase square-wave voltage to the input D'. IC 13 and IC 14 are used as pulse shapers; IC 15 and IC 16 are low-pass filters which filter the fundamental sine waves out of the square-wave voltages, and IC 17 and IC 18 generate sinusoidal a.c. voltages. The connection of IC 17 and IC 18 is described fully in my prior application U.S. Ser. No. 691,947.

Figure 10:
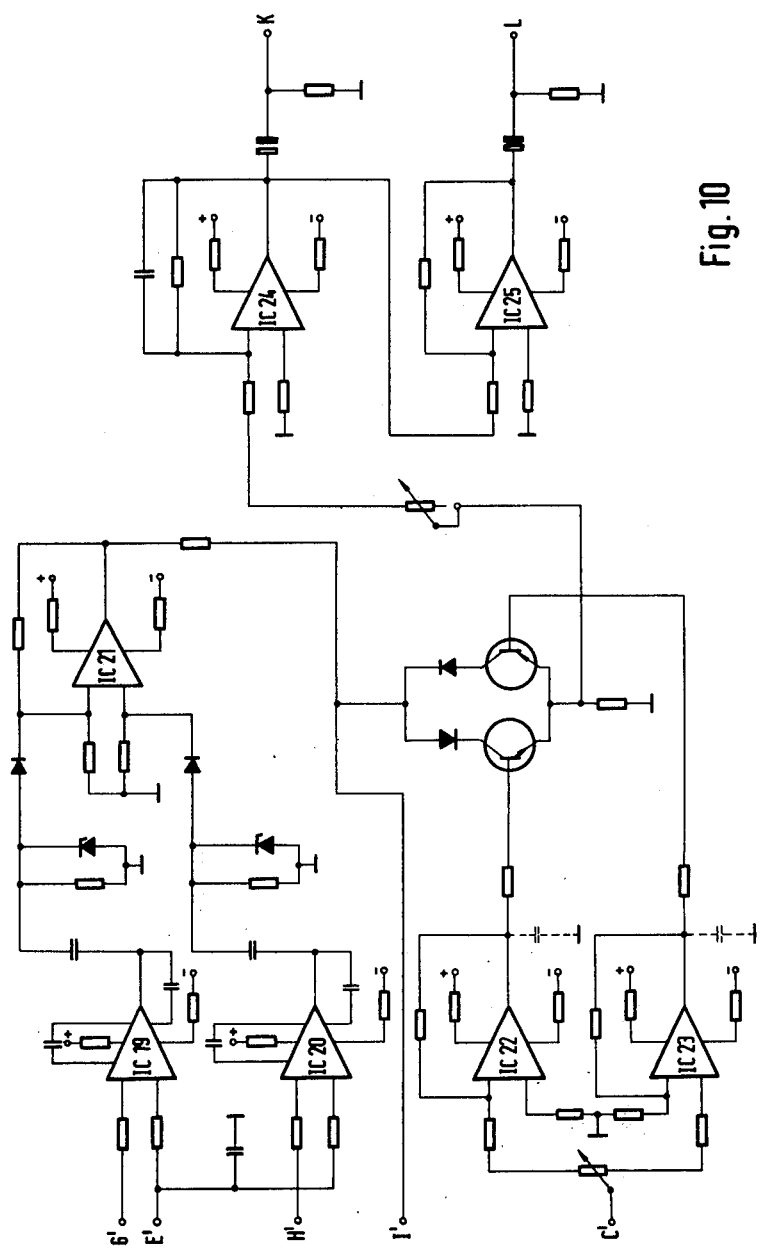
FIG. 10 is a circuit diagram for the arrangement illustrated in FIG. 6.

FIG. 10 shows the circuit arrangement of the block diagram of FIG. 6 for generating square-wave voltages shifted in phase by the angles $\psi_{13}$ and $\psi_{34}$. The triangular voltage applied to the inputs G' and H' of IC 19 and IC 20 is again the same as FIG. 9; only the d.c. voltage at the input E' is different for the desired phase angle $\psi_{13}$. The circuit arrangement comprising IC 19, IC 20 and IC 21 operates in the same way as the circuit comprising IC 10, IC 11 and IC 12 of FIG. 9.

At the output I', therefore, a square-wave voltage is present whose phase differs from that of the square-wave voltage of D (FIG. 8) by the angle $\psi_{13}$. The circuit arrangement comprising IC 22, IC 23, the electronic switch as well as IC 24, IC 25 operates similarly to the corresponding circuit of FIG. 8 (IC 4, IC 5, electronic switch IC 6, IC 9). The input C' is fed with the same frequency-proportional d.c. voltage as the input C' of FIG. 8.

As a result of the control of IC 21 which in turn is tied to the reference generator (circuit illustrated in FIG. 8), the integrator IC 24 in FIG. 10 is frequency-locked. A change in the frequency proportional d.c. voltage at C' does not result in a change of the frequency at the output K (as in the case of the circuit illustrated in FIG. 8) but in a change of the amplitude of the triangular voltage. Since, however, the amplitude of the d.c. voltage at C' is inversely proportional to the period of pulses at the electronic switch, rectangles of constant area are applied to the input of the integrator IC 24; thus, an out of phase triangular voltage of constant amplitude appears at the output K. This triangular voltage and the triangular voltage inverted in the IC 25 are used in a circuit analogous to FIG. 9 to derive a square-wave voltage shifted in phase by the angle $\psi_{34}$.

While the device of this invention has been illustrated and described in connection with a device for applying marks to a moving conductor, it will be appreciated that is as other applications and that various modifications may be made which do not depart from the scope of the appended claims.

What is claimed is:

1. An elelctronic arrangement for generating from an input a.c. voltage variable in frequency at least two output a.c. voltages variable in frequency which are continuously shiftable in phase with respect to each other by a constant, frequency dependent angle $0 < \psi < 180°$, comprising:

means for changing said variable input a.c. voltage to a triangular voltage of constant amplitude proportional in frequency to the input a.c. voltage;

means for deriving a first square-wave voltage from said triangular voltage;

means for inverting said triangular voltage;

separate comparator means connected to said triangular voltage means and inverted triangular voltage means;

manually variable d.c. voltage generating means connected to a second input of each of said comparator means;

bistable multivibrator means connected to said comparators for generating a second square-wave voltage shiftable in phase by an angle $\psi$ with respect to said first square-wave voltage by manually varying said d.c. voltage generating means.

2. The electronic arrangement in accordance with claim 1, including further means for changing said input a.c. voltage to a triangular voltage by inverting the input a.c. voltage to a frequency proportional d.c. voltage and deriving said triangular voltage therefrom.

3. In an apparatus for producing ring marks on a longitudinally advancing electrical conductor by successively spraying onto said conductor two half rings or a multiple thereof from two spraying nozzles disposed on opposite sides of said conductor and continuously emitting one color jet each which is caused to be oscillated by a deflection system to which is applied a high a.c. voltage, an electronic arrangement means as set forth in claim 1 connected to said deflection system, said apparatus further including:

fixed spraying nozzles for producing half rings on said conductor and wherein synchronization between producing two half rings is achieved by applying the outputs of said electronic arrangement as the deflecting voltages to the deflection system and said input a.c. voltage is provided by a tachometer generator driven by said conductor.

* * * * *